United States Patent
Shishido et al.

(10) Patent No.: US 9,864,268 B2
(45) Date of Patent: Jan. 9, 2018

(54) MASK BLANK, METHOD FOR MANUFACTURING TRANSFER MASK, AND METHOD FOR MANUFACTURING SEMICONDUCTOR DEVICE

(71) Applicant: HOYA CORPORATION, Tokyo (JP)

(72) Inventors: Hiroaki Shishido, Tokyo (JP); Osamu Nozawa, Tokyo (JP)

(73) Assignee: HOYA CORPORATION, Shinjuku-ku, Tokyo (JP)

( * ) Notice: Subject to any disclaimer, the term of this patent is extended or adjusted under 35 U.S.C. 154(b) by 0 days.

(21) Appl. No.: 15/129,904

(22) PCT Filed: Mar. 30, 2015

(86) PCT No.: PCT/JP2015/059852
§ 371 (c)(1),
(2) Date: Sep. 28, 2016

(87) PCT Pub. No.: WO2015/152123
PCT Pub. Date: Oct. 8, 2015

(65) Prior Publication Data
US 2017/0168384 A1 Jun. 15, 2017

(30) Foreign Application Priority Data

Mar. 30, 2014 (JP) ................................. 2014-070685

(51) Int. Cl.
*G03F 1/32* (2012.01)
*H01L 21/306* (2006.01)
(Continued)

(52) U.S. Cl.
CPC .................. *G03F 1/32* (2013.01); *G03F 1/48* (2013.01); *G03F 1/80* (2013.01); *H01L 21/3081* (2013.01);
(Continued)

(58) Field of Classification Search
CPC combination set(s) only.
See application file for complete search history.

(56) References Cited

U.S. PATENT DOCUMENTS

| | | | |
|---|---|---|---|
| 7,767,366 B2 * | 8/2010 | Yoshikawa | G03F 1/32 430/311 |
| 2005/0019674 A1 | 1/2005 | Okubo et al. | |

(Continued)

FOREIGN PATENT DOCUMENTS

| | | |
|---|---|---|
| JP | 06-069185 A | 3/1994 |
| JP | 2011227223 A * | 11/2011 |

(Continued)

OTHER PUBLICATIONS

International Search Report of PCT/JP2015/059852 dated May 12, 2015 [PCT/ISA/210].

*Primary Examiner* — Mamadou Diallo
(74) *Attorney, Agent, or Firm* — Sughrue Mion, PLLC

(57) ABSTRACT

In order to form a fine mask pattern with high accuracy, in a mask blank in which a light-semitransmissive film, a light shielding film, and a hard mask film are laminated in the stated order on a transparent substrate, the light-semitransmissive film containing silicon and additionally nitrogen, the hard mask film containing silicon or tantalum, and additionally oxygen, the light shielding film having the laminate structure of a lower layer, an intermediate layer, and an upper layer and containing chromium, conditions on the light shielding film are adjusted so that etching rates using a mixture gas of chlorine and oxygen are the lowest for the upper layer and the next lowest for the lower layer.

12 Claims, 3 Drawing Sheets

(51) Int. Cl.
    *G03F 1/48*     (2012.01)
    *G03F 1/80*     (2012.01)
    *H01L 21/308*     (2006.01)

(52) U.S. Cl.
    CPC .... *H01L 21/3086* (2013.01); *H01L 21/30604* (2013.01)

(56) References Cited

U.S. PATENT DOCUMENTS

| | | | | |
|---|---|---|---|---|
| 2011/0111332 | A1* | 5/2011 | Iwashita | G03F 1/58 430/5 |
| 2013/0273738 | A1* | 10/2013 | Sakai | G03F 1/46 438/689 |
| 2013/0309598 | A1* | 11/2013 | Fukaya | G03F 1/29 430/5 |
| 2015/0309598 | A1 | 10/2015 | Zeliff et al. | |
| 2017/0075210 | A1* | 3/2017 | Shishido | G03F 1/32 |

FOREIGN PATENT DOCUMENTS

| | | |
|---|---|---|
| JP | 2013-238776 A | 11/2013 |
| WO | 2004/090635 A1 | 10/2004 |
| WO | 2007/074806 A1 | 7/2007 |
| WO | 2009/157506 A1 | 12/2009 |

\* cited by examiner

MASK BLANK, METHOD FOR MANUFACTURING TRANSFER MASK, AND METHOD FOR MANUFACTURING SEMICONDUCTOR DEVICE

CROSS REFERENCE TO RELATED APPLICATIONS

This application is a National Stage of International Application No. PCT/JP2015/059852, filed Mar. 30, 2015, claiming priority based on Japanese Patent Application No. 2014-070685, filed Mar. 30, 2014, the contents of all of which are incorporated herein by reference in their entirety.

TECHNICAL FIELD

This invention relates to a method of manufacturing a transfer mask used in manufacturing a semiconductor device, and a mask blank used in manufacturing the transfer mask.

BACKGROUND ART

In general, in a manufacturing step of a semiconductor device, a fine pattern is formed using a photolithography method. Further, in forming the fine pattern, a large number of transfer masks (also generally called photomasks) are generally used. In a transfer mask, in general, a light shielding blocking fine pattern formed of a metal thin film or the like is provided on a transparent glass substrate. The photolithography method is also used in manufacturing this transfer mask.

The transfer mask is an original plate for transferring the same fine pattern in high volume. Therefore, the dimensional accuracy of a pattern formed on the transfer mask directly affects the dimensional accuracy of the fine pattern to be manufactured. As the degree of integration of a semiconductor circuit is improved, the dimensions of the pattern become smaller, and the accuracy of the transfer mask is required to be higher.

Hitherto, as such transfer mask, there have been well known a binary mask, in which a transfer pattern formed of a light shielding film is formed on a transparent substrate, e.g., a glass substrate, a phase shift mask, in which a transfer pattern formed of a phase shift film, or of a phase shift film and a light shielding film is formed on the transparent substrate, and other type of masks. There has also been known a halftone-type phase shift mask, in which a light shielding band is formed in a peripheral portion of a transfer pattern forming region.

For example, in WO-A-2004/090635 (Patent Document 1), there is described, as a mask blank for manufacturing a halftone-type transfer mask, a mask blank having the thin-film structure including, from a substrate side, a metal silicide-based transfer mask film (light-semitransmissive film), a light shielding film made of a chromium-based compound, and a hard mask film made of a silicon compound.

PRIOR ART DOCUMENTS

Patent Document

Patent Document 1: WO-A-2004/090635

SUMMARY OF THE INVENTION

Problem to be Solved by the Invention

When such mask blank as described in Patent Document 1 is patterned, first, the hard mask film made of the silicon compound is patterned by dry etching using a fluorine-based gas, and using as a mask a predetermined resist pattern formed on a surface of the mask blank. Next, the light shielding film made of the chromium-based compound is patterned by dry etching using a mixture gas of chlorine and oxygen, and using the patterned hard mask film as a mask. Subsequently, a metal silicide-based transfer mask film (light-semitransmissive film) is patterned by dry etching using a fluorine-based gas, and using the patterned light shielding film as a mask.

Meanwhile, when a proportion of a chromium element contained in a composition is high, the above-mentioned chromium-based light shielding film has a high extinction coefficient, and hence is advantageous in that high optical density is obtained even when a film thickness is reduced. However, when the proportion of the chromium element becomes higher, an etching rate becomes lower, and more time is required for the patterning. Therefore, there is a fear that the pattern of the hard mask film, which is above the light shielding film, may disappear before the patterning of the light shielding film is complete.

To the contrary, when the proportion of the chromium element contained in the composition is low, the etching rate becomes higher, but the extinction coefficient becomes lower. Therefore, in order to obtain predetermined optical density, the film thickness needs to be increased. Moreover, the mixture gas of chlorine and oxygen, which is used in the dry etching of the chromium-based light shielding film, has a property of isotropic etching. Therefore, there is also a problem in that, when the etching rate is high because the chromium component is small, and the film thickness is thick, side walls of the pattern are also eroded by the etching gas, and a cross section of the pattern becomes a hollow shape. For example, with a pattern having a dimension of 80 nm or more, even when the cross section of the light shielding film pattern becomes the hollow shape by the etching of the light shielding film, a contact area between the light shielding film pattern and the transfer mask film (light-semitransmissive film), which is immediately below the light shielding film pattern, can be gained with respect to a height of the formed light shielding film pattern, and hence there is little risk that the light shielding film pattern may fall. However, in a case of a sub resolution assist features (SRAF) pattern having a dimension of 50 nm or less, when a hollow phenomenon comparable to the above-mentioned case occurs, the contact area between the light shielding film pattern and the transfer mask film (light-semitransmissive film) becomes much smaller with respect to the height of the light shielding film pattern, and the light shielding film pattern may fall in some cases. When the light shielding film pattern falls, it becomes difficult to pattern the transfer mask film (light-semitransmissive film) using the light shielding film pattern as the mask.

Moreover, when a degree by which the cross section of the light shielding film pattern is hollowed is large, the dimension of the light shielding film pattern becomes thinner than that of the hard mask film pattern, which is above the light shielding film pattern, and pattern accuracy of the transfer mask film, which is formed by the patterning using the light shielding film pattern as the mask, is deteriorated, even if the light shielding film pattern does not fall.

As described above, when such fine pattern as the SRAF pattern, for example, is to be formed in the transfer mask film using the mask blank having the related-art configuration, it is difficult to obtain high pattern accuracy.

This invention has been made in view of the above-mentioned problems in the relate art, and therefore has the following objects: firstly, to provide a mask blank capable of forming even a fine transfer pattern, e.g., an SRAF pattern, with high accuracy; secondly, to provide a method of manufacturing a transfer mask in which the fine pattern is formed with high accuracy using such mask blank; and thirdly, to provide a method of manufacturing a high-quality semiconductor device with excellent pattern accuracy using such transfer mask.

Means to Solve the Problem

The inventors of this invention have devised this invention based on findings obtained as a result of conducting, on a mask blank having the structure in which a light-semitransmissive film, a light shielding film, and a hard mask film are laminated in the stated order on a transparent substrate, intense research in which the above-mentioned light shielding film has a predetermined laminated structure, focusing attention on etching rates for dry etching using a mixture gas of a chlorine gas and an oxygen gas in respective layers of the light shielding film.

Specifically, in order to solve the problems described above, this invention has the following configuration.

(Configuration 1)

A mask blank having a structure in which a light-semitransmissive film, a light shielding film, and a hard mask film are laminated in the stated order on a transparent substrate, the light-semitransmissive film at least containing silicon, the hard mask film at least containing any one or both of silicon and tantalum, the light shielding film having a laminated structure of a lower layer, an intermediate layer, and an upper layer, and containing chromium, the light shielding film being dry-etched using a mixture gas of a chlorine gas and an oxygen gas at a lowest etching rate in the upper layer, and at a next lowest etching rate in the lower layer.

According to Configuration 1, the upper layer of the light shielding film containing chromium, which is immediately below the hard mask film, is dry-etched using the mixture gas of the chlorine gas and the oxygen gas at the lowest etching rate in the light shielding film, and hence side etching is less likely to occur, that is, side walls of the pattern are less likely to be eroded, during the etching. With the side etching in the upper layer of the light shielding film being less likely to occur, a pattern shape of the hard mask film, which is immediately above the upper layer of the light shielding film, is transferred substantially accurately to the upper layer. With the light shielding film including the upper layer, to which the pattern shape of the hard mask film has been transferred substantially accurately, the pattern of the hard mask film can also be formed substantially accurately in the light-semitransmissive film containing silicon, which is patterned using the pattern of the light shielding film as the mask.

Moreover, according to Configuration 1, there is adopted the film design in which the intermediate layer of the light shielding film has the highest etching rate, and hence the etching rate of the light shielding film as a whole can be increased.

Moreover, the lower layer, which has the etching rate that is the next lowest to that of the upper layer, has the etching rate that is lower than that of the intermediate layer, and hence the side etching is less likely to occur, that is, the side walls of the pattern are less likely to be eroded, than in the intermediate layer. Therefore, in the course of etching the lower layer, excessive erosion of the side walls by the side etching is suppressed, and hence a contact area between the light shielding film pattern and the light-semitransmissive film can be secured in the lower layer of the light shielding film. As a result, even when a pattern having a dimension of 50 nm or less is to be formed, for example, the light shielding film pattern does not fall.

As described above, according to Configuration 1, even such fine transfer pattern as the SRAF pattern can be formed in the light-semitransmissive film, which functions as the transfer mask film of the mask blank according to this invention, with high accuracy, and as a result, the transfer mask with excellent pattern accuracy can be manufactured.

(Configuration 2)

The mask blank according to Configuration 1, wherein the light shielding film has a highest content of the chromium in the upper layer, and a next highest content of the chromium in the lower layer.

As in Configuration 2, with the upper layer portion of the light shielding film including a region having the highest content of chromium, the upper layer is dry-etched using the mixture gas of the chlorine gas and the oxygen gas at the lowest etching rate in the light shielding film, and as described above, the pattern shape of the hard mask film, which is immediately above the upper layer of the light shielding film, is substantially accurately transferred to the upper layer. As a consequence, the transfer mask having the excellent pattern shape can be manufactured. Moreover, the lower layer has the content of chromium that is next highest to that of the upper layer, and hence has good adhesion with the light-semitransmissive film, which has film quality that is different from that of the light shielding film. As a result, the falling of the light shielding film pattern can be suppressed more effectively. The intermediate layer has the lowest content of chromium. As a result, such intermediate layer can be included to increase the etching rate of the light shielding film as a whole, although with erosion in the side wall portion of the pattern during the etching.

(Configuration 3)

The mask blank according to Configuration 1 or 2, wherein the light shielding film further contains oxygen, and has a content of the oxygen that is lower in the lower layer than in the intermediate layer.

As in Configuration 3, with the content of oxygen in the light shielding film being smaller in the lower layer than in the intermediate layer, the intermediate layer has the highest content of oxygen, and hence the etching rate of the intermediate layer is higher. Therefore, the etching rate of the entire light shielding film can be kept high. Moreover, with the lower layer having the content of oxygen that is lower than that of the intermediate layer, the etching rate in a depth direction becomes lower when the etching proceeds from the intermediate layer to the lower layer, but the progress of the side etching in the pattern of the lower layer also becomes slower. Consequently, a dimension in a width direction of the pattern can be maintained in the lower layer, and as a result, the contact area between the pattern of the light shielding film and the light-semitransmissive film can be maintained. Further, with the content of oxygen in the lower layer being relatively low, there can also be obtained the effect of further increasing the adhesion between the light shielding film pattern and the light-semitransmissive film.

(Configuration 4)

The mask blank according to any one of Configurations 1 to 3, wherein the upper layer has a content of the chromium of 60 at % or more.

As in Configuration 4, with the upper layer of the light shielding film having the content of chromium of 60 at % or more, the optical density of the entire light shielding film can be increased by the upper layer, and the etching rate of the dry etching in the upper layer becomes lower to suppress the side etching in the upper layer portion. As a result, the pattern shape of the hard mask film, which is immediately above the upper layer, can be transferred substantially accurately, and consequently, the transfer mask having the excellent pattern shape can be manufactured.

(Configuration 5)

The mask blank according to any one of Configurations 1 to 4, wherein the upper layer has a thickness of 3 nm or more and 8 nm or less.

As in Configuration 5, with the upper layer of the light shielding film having the thickness in a range of 3 nm or more and 8 nm or less, the good patterning accuracy for the upper layer can be maintained while satisfactorily suppressing the etching time of the upper layer.

(Configuration 6)

The mask blank according to any one of Configurations 1 to 5, wherein the intermediate layer is dry-etched using the mixture gas of the chlorine gas and the oxygen gas at the etching rate that is three times the etching rate at which the upper layer is dry-etched using the mixture gas of the chlorine gas and the oxygen gas or more.

As in Configuration 6, with the intermediate layer being dry-etched using the mixture gas of the chlorine gas and the oxygen gas at the etching rate that is three times the etching rate of the upper layer or more, the etching rate in the depth direction is increased when the etching proceeds from the upper layer to the intermediate layer, and the etching in the depth direction of the intermediate layer can be completed while suppressing the progress of the side etching of the upper layer.

(Configuration 7)

The mask blank according to any one of Configurations 1 to 6, wherein the intermediate layer is dry-etched using the mixture gas of the chlorine gas and the oxygen gas at the etching rate that is two times the etching rate at which the lower layer is dry-etched using the mixture gas of the chlorine gas and the oxygen gas or less.

When the etching proceeds from the intermediate layer to the lower layer, the etching rate in the depth direction is decreased as in Configuration 1, but as in Configuration 7, with the etching rate of the intermediate layer being two times the etching rate of the lower layer or less, the etching in the lower layer and necessary over etching are completed during the etching of the lower layer before the side etching proceeds more in the intermediate layer, and hence formation of a step can be suppressed especially at the interface of the side walls of the pattern between the intermediate layer and the lower layer.

(Configuration 8)

The mask blank according to any one of Configurations 1 to 7, wherein the hard mask film contains oxygen.

The hard mask film needs to be made of a material having high etching selectivity with respect to the light shielding film, which is immediately below the hard mask film. As in Configuration 8, a material containing an oxide of silicon or tantalum and the like can be selected for the hard mask film to secure the high etching selectivity with respect to the light shielding film, which is made of a chromium-based material, and not only a resist but also the hard mask film can be reduced in thickness. Therefore, accuracy of transferring the resist pattern formed in the surface of the mask blank is improved.

(Configuration 9)

The mask blank according to any one of Configurations 1 to 8, wherein the light-semitransmissive film contains silicon and nitrogen.

As in Configuration 9, a material containing silicon and nitrogen can be applied to the light-semitransmissive film to secure etching selectivity with respect to the light shielding film, which is made of the chromium-based material. Moreover, when the material containing silicon and nitrogen is used, patterning using an anisotropic fluorine-based gas as an etching gas can be applied. Therefore, the light shielding film pattern, to which the pattern shape of the hard mask film has been transferred substantially accurately, can be used as the mask to also form a pattern having excellent pattern accuracy in the light-semitransmissive film.

(Configuration 10)

The mask blank according to any one of Configurations 1 to 9, wherein the light-semitransmissive film and the light shielding film form a laminated structure having a transmittance of 0.2% or less with respect to an ArF excimer laser light (wavelength: 193 nm), and a transmittance of 50% or less with respect to light having a wavelength in at least a part of a wavelength region of from 800 nm to 900 nm.

The resist is not sensitive to light in a near-infrared region having a wavelength of from 800 nm to 900 nm, and hence the light is used for alignment when the mask blank is placed in an exposure apparatus. As in Configuration 10, the laminated structure of the light-semitransmissive film and the light shielding film has a transmittance of 0.2% or less with respect to the ArF excimer laser light (wavelength: 193 nm), and a transmittance of 50% or less with respect to light having a wavelength in at least a part of the wavelength region of from 800 nm to 900 nm. Thus, the laminated structure has good light shielding property with respect to the ArF excimer laser light as the exposure light, and enables easy placement of the mask blank in the exposure apparatus in a preferred manner.

(Configuration 11)

The mask blank according to any one of Configurations 1 to 10, wherein the hard mask film and the light-semitransmissive film are patterned by dry etching using a fluorine-based gas.

According to Configuration 11, the hard mask film and the light-semitransmissive film are patterned by the dry etching using the anisotropic fluorine-based gas. Consequently, together with the substantially accurate transfer of the pattern shape of the hard mask film, which is immediately above the upper layer of the light shielding film; to the upper layer, the transfer pattern can be formed with excellent form accuracy of the pattern in the light-semitransmissive film by the patterning using the light shielding film as the mask.

(Configuration 12)

A method of manufacturing a transfer mask using the mask blank of any one of Configurations 1 to 11, the method comprising the steps of: forming a light-semitransmissive film pattern in the hard mask film by dry etching using a fluorine-based gas and using as a mask a resist film, which is formed on the hard mask film and has the light-semitransmissive film pattern; forming the light-semitransmissive film pattern in the light shielding film by dry etching using a mixture gas of a chlorine gas and an oxygen gas, and using as a mask the hard mask film, in which the light-semitransmissive film pattern has been formed; forming the light-semitransmissive film pattern in the light-semitransmissive film by dry etching using a fluorine-based gas and using as a mask the light shielding film, in which the light-semitransmissive film pattern has been formed; and forming a light shielding pattern in the light shielding film by dry etching using a mixture gas of a chlorine gas and an oxygen gas, and using as a mask a resist film, which is formed on the light shielding film and has the light shielding pattern.

As in Configuration 12, the transfer mask can be manufactured following the above-mentioned manufacturing steps and using the mask blank according to this invention to obtain the transfer mask in which such fine pattern as the SRAF pattern is formed with high accuracy.

(Configuration 13)

A method of manufacturing a semiconductor device, comprising a step of patterning and transferring a transfer pattern of a transfer mask, which is manufactured by the method of manufacturing a transfer mask of Configuration 12, on a semiconductor substrate by a lithography method using the transfer mask.

As in Configuration 13, a high-quality semiconductor device can be obtained with excellent pattern accuracy using the transfer mask in which the above-mentioned fine pattern is formed with high accuracy.

Effect of the Invention

According to the mask blank of this invention, such fine transfer pattern as the SRAF pattern can be formed with high accuracy. In other words, according to the mask blank of this invention, the etching rate is the lowest for the upper layer of the light shielding film, and hence the pattern of the upper layer is less susceptible to the side etching. As a result, the light shielding film pattern to which the shape of the transfer pattern, which is formed in the resist film or the hard mask film, is transferred substantially accurately can be formed, and hence the accuracy of the pattern, which is to be formed in the light-semitransmissive film using the light shielding film pattern as the mask, can be increased. Moreover, the etching rate of the lower layer of the light shielding film is the next lowest to that for the upper layer, and is lower as compared to that of the intermediate layer, and hence the pattern of the lower layer can be made less susceptible to the side etching. As a result, the sufficient contact area between the light shielding film pattern and the light-semitransmissive film can be secured, and the good adhesion can be obtained. Therefore, even when such fine pattern as the SRAF pattern is formed, the light shielding film pattern does not fall, and hence the light-semitransmissive film pattern can also be formed with the high accuracy.

Moreover, the transfer mask in which the fine pattern is formed with high accuracy can be manufactured using the above-mentioned mask blank according to this invention.

Further, the high-quality semiconductor device having the excellent pattern accuracy can be manufactured using the above-mentioned transfer mask.

MODES FOR EMBODYING THE INVENTION

Now, an embodiment of this invention is described in detail with reference to the drawings.

As described above, as a result of conducting, on a mask blank having the structure in which a light-semitransmissive film, a light shielding film, and a hard mask film are laminated in the stated order on a transparent substrate, intense research in which the light shielding film has the predetermined laminated structure, focusing attention on etching rates for dry etching using a mixture gas of a chlorine gas and an oxygen gas in the respective layers of the light shielding film, the inventors of this invention have found that the above-mentioned problems can be solved by this invention having the following configurations.

That is, as in the above-mentioned Configuration 1, this invention is a mask blank having a structure in which a light-semitransmissive film, a light shielding film, and a hard mask film are laminated in the stated order on a transparent substrate, the light-semitransmissive film at least containing silicon, the hard mask film at least containing any one or both of silicon and tantalum, the light shielding film having a laminated structure of a lower layer, an intermediate layer, and an upper layer, and containing chromium, the light shielding film being dry-etched using a mixture gas of a chlorine gas and an oxygen gas at a lowest etching rate in the upper layer, and at a next lowest etching rate in the lower layer.

Figure 1:
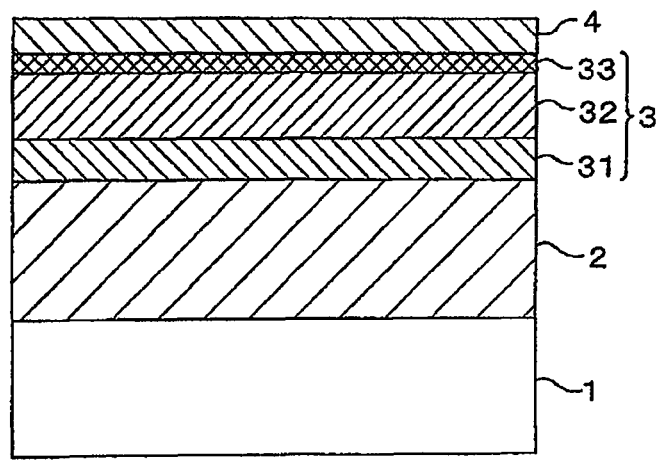
FIG. 1 is a schematic cross-sectional view of a mask blank according to one embodiment of this invention.

FIG. 1 is a schematic cross-sectional view of a mask blank according to one embodiment of this invention.

As illustrated in FIG. 1, a mask blank 10 according to one embodiment of this invention has the structure in which a light-semitransmissive film 2, a light shielding film 3, and a hard mask film 4 are laminated in the stated order on a transparent substrate 1. Moreover, the light shielding film 3 has a laminated structure of a lower layer 31, an intermediate layer 32, and an upper layer 33.

In the mask blank 10, the light-semitransmissive film 2 at least contains silicon, and the hard mask film 4 at least contains any one or both of silicon and tantalum. Moreover, the light shielding film 3 having the laminated structure contains chromium. Note that, although details are to be described below, it is particularly preferred to apply a material containing silicon and nitrogen to the light-semitransmissive film 2, and it is particularly preferred to apply a material containing silicon and oxygen to the hard mask film 4.

Here, the transparent substrate 1 in the mask blank 10 is not particularly limited as long as being a substrate used in a transfer mask for manufacturing a semiconductor device. When used in a blank for a phase shift type mask, the transparent substrate is not particularly limited as long as being a substrate having transparency with respect to an exposure wavelength to be used, and a synthetic quartz substrate and other such glass substrates (for example, soda-lime glass, aluminosilicate glass, and other type of glass) are used. Among others, the synthetic quartz substrate has high transparency in a region of ArF excimer laser (wavelength: 193 nm) or lower wavelength, which is effective in forming a fine pattern, and hence is used particularly preferably.

A material containing silicon (Si) or a material containing tantalum (Ta) can be used as such hard mask film 4. An example of the material containing silicon (Si), which is suitable for the hard mask film 4, is a material containing silicon (Si) and one or more elements selected from oxygen (O), nitrogen (N), carbon (C), boron (B), and hydrogen (H). Another example of the material containing silicon (Si), which is suitable for the hard mask film 4, is a material containing silicon (Si), a transition metal, and one or more elements selected from oxygen (O), nitrogen (N), carbon (C), boron (B), and hydrogen (H). In addition, examples of the transition metal include molybdenum (Mo), tungsten (W), titanium (Ti), tantalum (Ta), zirconium (Zr), hafnium (Hf), niobium (Nb), vanadium (V), cobalt (Co), chromium (Cr), nickel (Ni), ruthenium (Ru), and tin (Sn).

Meanwhile, an example of the material containing tantalum (Ta), which is suitable for hard mask film 4, is a material containing tantalum (Ta) and one or more elements selected from oxygen (O), nitrogen (N), carbon (C), boron (B), and hydrogen (H). Of those, a material containing tantalum (Ta) and oxygen (O) is particularly preferred. Specific examples of such material include tantalum oxide (TaO), tantalum oxynitride (TaON), tantalum borate (TaBO), and tantalum boron oxynitride (TaBON).

Moreover, it is preferred that the hard mask film 4 be formed of a material containing oxygen (O) in addition to silicon (Si) or tantalum (Ta). Such hard mask film 4 has sufficient etching selectivity with respect to the light shielding film 3, which is formed of a material containing chromium (Cr), and the hard mask film 4 may be removed by etching while hardly damaging the light shielding film 3.

Specific examples of the material for forming such hard mask film 4 include silicon oxide ($SiO_2$), silicon oxynitride (SiON), tantalum oxide (TaO), tantalum oxynitride (TaON), tantalum borate (TaBO), and tantalum boron oxynitride (TaBON).

The hard mask film 4 formed of the material containing silicon and oxygen tends to be low in adhesion with the resist film made of the organic-based material, and hence it is preferred to perform hexamethyldisilazane (HMDS) processing on a surface of the hard mask film 4 to improve the adhesion of the surface.

The film thickness of the hard mask film 4 does not need to be particularly restricted, but is required to have at least such film thickness as not to disappear before the etching of the light shielding film 3, which is immediately below the hard mask film 4, is complete. Meanwhile, when the film thickness of the hard mask film 4 is thick, it is difficult to reduce the thickness of the resist pattern, which is immediately above the hard mask film 4. From such viewpoints, in this embodiment, the film thickness of the hard mask film 4 is preferably in a range of 1.5 nm or more and 20 nm or less, and particularly preferably 2.5 nm or more and 6 nm or less.

The light-semi transmissive film 2 is formed of a material at least containing silicon, but a configuration of the light-semitransmissive film 2 that is applicable to this invention does not need to be particularly limited, and there may be applied a configuration of a light-semitransmissive film of a phase shift type mask that has hitherto been used, for example.

Preferred examples of such light-semitransmissive film 2 include, for example, a metal silicide-based light-semitransmissive film made of a transition metal and silicon, a metal silicide-based light-semitransmissive film made of a transition metal, silicon, and a material containing one or more elements selected from oxygen, nitrogen, and carbon, and a silicon-based light-semitransmissive film made of silicon and a material containing oxygen, nitrogen, carbon, boron, and the like. Examples of the transition metal contained in the above-mentioned metal silicide-based light-semitransmissive film include molybdenum, tantalum, tungsten, titanium, chromium, nickel, vanadium, zirconium, ruthenium, and rhodium. Of those, molybdenum is particularly suitable.

As the above-mentioned material containing a transition metal and silicon, specifically, a transition metal silicide, or a material containing a nitride, oxide, carbide, oxynitride, carbonate, or carbon oxynitride of a transition metal silicide is suitable. In addition, as the above-mentioned material containing silicon, specifically, a material containing a nitride, oxide, carbide, oxynitride (oxide nitride), carbonate (carbide oxide), or carbon oxynitride (carbide oxide nitride) of silicon is suitable.

Moreover, in this invention, the light-semitransmissive film 2 may be applied to any one of a single-layer structure, or a laminated structure formed of a low-transmittance layer and a high-transmittance layer.

It is desired that a preferred film thickness of the light-semitransmissive film 2 be appropriately adjusted in view of a phase shift function and light transmittance, in particular, depending on the material. In general, the film thickness is in a range of preferably 100 nm or less, and more preferably 80 nm or less.

Moreover, the light shielding film 3 having the above-mentioned laminated structure is formed of a material containing chromium.

Examples of the above-mentioned material containing chromium include, for example, Cr simple substance or Cr compounds, e.g., CrX such as CrN, CrC, CrO, CrON, CrCN, CrOC, and CrOCN, where X represents at least one kind selected from N, C, O, and the like.

A method of forming a thin film made of a laminate film, in which the light-semitransmissive film 2, the light shielding film 3, and the hard mask film 4 are laminated in the stated order, on the transparent substrate 1, e.g., the mask blank 10 illustrated in FIG. 1, does not need to be particularly limited, but a preferred example includes, among others, a sputter deposition method. The sputter deposition method is preferred because a uniform film having a constant film thickness may be formed.

In the mask blank 10 according to this embodiment, as described above in Configuration 1, the light shielding film 3 has the laminated structure of the lower layer 31, the intermediate layer 32, and the upper layer 33, and contains chromium, and the etching rate at which the light shielding film 3 is dry-etched using the mixture gas of the chlorine gas and the oxygen gas has the feature of being the lowest for the upper layer 33 and being the next lowest for the lower layer 31.

As described above, the upper layer 33 of the light shielding film 3 containing chromium, which is immediately below the hard mask film 4, is dry-etched using the mixture gas of the chlorine gas and the oxygen gas at the etching rate (hereinafter sometimes simply referred to as "etching rate" for convenience of the description, but means the etching rate of the dry etching using the mixture gas of the chlorine gas and the oxygen gas) that is the lowest in the light shielding film 3, and hence is hardly susceptible to the side etching during the etching (in other words, the side walls of the pattern are hardly eroded). The upper layer 33 portion of the light shielding film 3 is hardly susceptible to the side etching, and hence the pattern shape of the hard mask film 4, which is immediately above the upper layer 33 of the light shielding film 3, is transferred to the upper layer 33 substantially accurately. With the resist film to be formed on the front surface of the mask blank 10 being reduced in thickness, the resist pattern having the transfer pattern to be eventually formed in the light-semitransmissive film 2 is transferred correctly to the hard mask film 4, and hence the pattern shape of the hard mask film 4 is transferred to the upper layer 33 substantially accurately. With the light shielding film 3 including the upper layer 33 having little difference from the pattern shape (for example, pattern dimension) formed in the resist film, the pattern of the hard mask film 4 may also be formed substantially accurately in the light-semitransmissive film 2 containing silicon, which is patterned by anisotropic etching using the pattern of the light shielding film 3 as the mask. In short, the pattern of the light-semitransmissive film 2 may be formed without a divergence in dimension from the resist pattern or the hard mask film pattern, and hence the accuracy of the pattern to be formed in the light-semitransmissive film 2 may be increased.

Moreover, there is adopted the film design in which the intermediate layer 32 of the light shielding film 3 has the highest etching rate, and hence the etching rate of the light shielding film 3 as a whole may be increased. The intermediate layer 32 has a film thickness of preferably from 30% to 70%, and more preferably from 50% to 60% of the total film thickness of the light shielding film 3. When the film thickness of the intermediate layer 32 is too thin, the effect of increasing the etching rate of the entire light shielding film 3 is reduced. When the film thickness is too thick, the intermediate layer 32 is side-etched too deeply, and hence there is a fear that recovery of the pattern shape in the lower layer 31 may become insufficient.

Moreover, the lower layer 31, which has the etching rate that is the next lowest to that of the upper layer 33, has the etching rate that is lower than that of the intermediate layer 32, and hence is less susceptible to the side etching (that is, the side walls of the pattern are less likely to be eroded) than in the intermediate layer 32. Therefore, in the course of etching the lower layer 31, excessive erosion of the side walls by the side etching is suppressed, with the result that the pattern shape of the upper layer 33 may be recovered, and further that a contact area between the pattern of the light shielding film 3 and the light-semitransmissive film 2 can be secured in the lower layer 31 of the light shielding film 3. As a result, when a pattern having a dimension, for example, of 50 nm or less is to be formed, the light shielding film pattern does not fall.

As described above, in the mask blank 10 of this embodiment, the light shielding film 3 is provided for the purpose of transferring the pattern of the hard mask film 4 to the light-semitransmissive film 2 as closely as possible. In the transfer mask, that is, the phase shift type mask manufactured using the mask blank 10, the final transfer pattern is the pattern formed in the light-semitransmissive film 2, and the pattern formed in the light shielding film 3 does not function as the transfer pattern, and hence the cross-sectional shape of the light shielding film pattern itself is not quite important. In the cross-sectional shape of the pattern of the light shielding film 3, even when there is some erosion in the side walls due to the side etching in the intermediate layer 32 portion, as described above, the light shielding film 3 having the above-mentioned laminated structure according to this invention may transfer the pattern of the hard mask film 4 to the light-semitransmissive film 2 as closely as possible, and hence there is no problem in the cross-sectional shape of the light shielding film 3.

According to this embodiment, even such fine transfer pattern as the SRAF pattern may be formed in the light-semitransmissive film as the transfer mask film with high accuracy, and as a result, the transfer mask with excellent pattern accuracy may be manufactured.

A method of adjusting the etching rates of the respective layers of the light shielding film 3 is not particularly limited, but in this invention, it is preferred to adjust the etching rates by varying the compositions of the respective layers forming the light shielding film 3. Basically, the etching rates may be adjusted by adjusting the contents of chromium in the respective layers, but the etching rates may be adjusted, for example, by adjusting degrees of oxidation, degrees of nitriding, and the like of chromium in the respective layers, and by varying components other than chromium in the compositions of the respective layers. Moreover, the etching rates of the respective layers may be adjusted by adjusting amount of additional elements (for example, indium and molybdenum) that may increase the etching rates.

It is preferred that the light shielding film 3 have the highest content of chromium in the upper layer 33, and the next highest content of the chromium in the lower layer 31 (invention of Configuration 2).

With the upper layer 33 portion of the light shielding film 3 including the region having the highest content of chromium, the upper layer 33 is dry-etched using the mixture gas of the chlorine gas and the oxygen gas at the lowest etching rate in the light shielding film 3. Therefore, the upper layer 33 becomes less susceptible to the side etching, and the pattern shape of the hard mask film 4, which is immediately above the upper layer 33 of the light shielding film 3, may be transferred to the upper layer 33 substantially accurately. Consequently, the transfer mask having the excellent pattern shape may be manufactured. Moreover, the upper layer 33 having the highest content of chromium has a high extinction coefficient, and hence also has the effect of increasing the optical density of the entire light shielding film 3.

Moreover, the lower layer 31 has the content of chromium that is next highest to that of the upper layer 33, and hence has the good adhesion with the light-semitransmissive film 2, which has film quality that is different from that of the light shielding film 3, with the result that the falling of the light shielding film pattern may be suppressed more effectively. In other words, the lower layer 31 has a relatively high content of chromium, and hence has a relatively large number of dangling bond sites (holes) of chromium. Consequently, the adhesion with the light-semitransmissive film 2 having the different film quality is improved, and hence the falling of the light shielding film pattern may be suppressed more effectively. In particular, in a case of a metal silicon-based light-semitransmissive film to which annealing has been applied, the surface of the light-semitransmissive film is in an oxygen-rich state. As a result, the above-mentioned dangling sites of chromium and oxygen in the light-semitransmissive film are connected by chemical bonds at an interface between the light shielding film 3 and the light-semitransmissive film 2, and hence improve adhesion.

The intermediate layer 32 has a film composition having the lowest content of chromium in the light shielding film 3. As a result, although the side wall portion of the pattern is eroded during the etching, such intermediate layer 32 may be included to increase the etching rate of the light shielding film 3 as a whole.

In the light shielding film 3, it is preferred that the upper layer 33 have the content of chromium of 60 at % or more (invention of Configuration 4).

With the upper layer 33 of the light shielding film 3 having the content of chromium of 60 at % or more, the optical density of the entire light shielding film 3 may be increased by the upper layer 33, and the etching rate in the upper layer 33 becomes lower to suppress the side etching in the upper layer portion. As a result, the pattern shape of the hard mask film 4, which is immediately above the upper layer 33, may be transferred substantially accurately, and consequently, the transfer mask having the excellent pattern shape may be manufactured.

Further, when the light shielding film 3 further contains oxygen, it is preferred that the content of oxygen be lower in the lower layer 31 than in the intermediate layer 32 (invention of Configuration 3).

With the content of oxygen in the light shielding film 3 being smaller in the lower layer 31 than in the intermediate layer 32, the intermediate layer 32 has the highest content of oxygen, and hence the etching rate of the intermediate layer 32 is higher. Therefore, the etching rate of the entire light shielding film 3 may be kept high. Moreover, with the lower layer 31 having the content of oxygen that is lower than that of the intermediate layer 32, the etching rate in the depth direction becomes lower when the etching proceeds from the intermediate layer 32 to the lower layer 31, but the progress of the side etching in the pattern of the lower layer 31 also becomes slower. Consequently, the pattern shape of the upper layer 33 is recovered in the lower layer 31, and the dimension in the width direction of the pattern is maintained, with the result that the contact area between the pattern of the light shielding film 3 and the light-semitransmissive film 2 may be maintained. Further, with the content of oxygen in the lower layer 31 being relatively low, exchanges with oxygen in the light-semitransmissive film 2 occur to lead to the connection by the chemical bonds. Thus, there may also be obtained the effect of further increasing the adhesion between the pattern of the light shielding film 3 and the light-semitransmissive film 2.

Further, in the light shielding film 3, it is preferred that the upper layer 33 have a thickness of 3 nm or more and 8 nm or less (invention of Configuration 5).

When the thickness of the upper layer 33 falls below 3 nm, the risk of the erosion of the side walls of the pattern in the upper layer 33 during the dry etching is increased. Moreover, when the thickness of the upper layer 33 exceeds 8 nm, there arises a fear that etching time for the upper layer 33 may be increased. Therefore; with the upper layer 33 of the light shielding film 3 having the thickness in the above-mentioned range of 3 nm or more and 8 nm or less, the good patterning accuracy in the upper layer 33 may be maintained while satisfactorily suppressing the etching time of the upper layer 33.

Moreover, in this invention, as described above, the etching rate at which the light shielding film 3 is dry-etched using the mixture gas of the chlorine gas and the oxygen gas has the feature of being the lowest for the upper layer 33 and being the next lowest for the lower layer 31 so that there is adopted a configuration in which the etching rate is the highest for the intermediate layer 32. Further, in this case, it is preferred that the etching rate of the intermediate layer 32 of the light shielding film 3 be three times the etching rate of the upper layer 33 or more (invention of Configuration 6).

In this manner, with the etching rate of the intermediate layer 32 being three times the etching rate of the upper layer 33 or more, the etching rate in the depth direction is increased when the etching proceeds from the upper layer 33 to the intermediate layer 32, and the etching in the depth direction of the intermediate layer 32 may be completed while suppressing the progress of the side etching of the upper layer 33 in a preferred manner.

Further, in the above-mentioned case, it is preferred that the etching rate of the intermediate layer 32 be two times the etching rate of the lower layer 31 or less (invention of Configuration 7).

When the etching proceeds from the intermediate layer 32 to the lower layer 31, the etching rate in the depth direction is decreased, but with the etching rate of the intermediate layer 32 being two times the etching rate of the lower layer 31 or less, the etching in the lower layer 31 and necessary over etching are completed during the etching of the lower layer 31 before the side etching proceeds more in the intermediate layer 32, and hence formation of a step may be suppressed especially at the interface of the side walls of the pattern between the intermediate layer 32 and the lower layer 31.

Moreover, in this invention, the hard mask film 4 at least contains any one or both of silicon and tantalum, but is preferably formed of a material containing oxygen in addition to silicon and tantalum, in particular (invention of Configuration 8).

The hard mask film 4 needs to be made of a material having high etching selectivity with respect to the light shielding film 3, which is immediately below the hard mask film 4. In particular, a material containing silicon and oxygen or a material containing tantalum and oxygen may be selected for the hard mask film 4 to secure the high etching selectivity with respect to the light shielding film 3, which is made of the chromium-based material, and hence not only the resist film but also the hard mask film 4 may be reduced in thickness. Therefore, accuracy of transferring the resist pattern, which includes the transfer pattern formed on the surface of the mask blank, to the hard mask film 4 is improved.

Moreover, in this invention, the light-semitransmissive film 2 at least contains silicon, but is preferably formed of a material containing silicon and nitrogen, in particular (invention of Configuration 9).

With the material containing silicon and oxygen being applied to the light-semitransmissive film 2, the etching selectivity with respect to the chromium-based light shielding film 3 may be secured. Alternatively, when the material containing silicon and nitrogen is used, the patterning using the anisotropic fluorine-based gas as the etching gas may be applied. Therefore; the transfer pattern having the excellent pattern accuracy may also be formed in the light-semitransmissive film 2 by the anisotropic etching using as the mask the pattern of the light shielding film 3; to which the pattern shape of the hard mask film 4 has been transferred substantially accurately.

Further, it is preferred that, in the mask blank 10 of this embodiment, the light-semitransmissive film 2 and the light shielding film 3 form a laminated structure having a transmittance of 0.2% or less with respect to an ArF excimer laser light (wavelength: 193 nm), and a transmittance of 50% or less with respect to light having a wavelength in at least a part of a wavelength region of from 800 nm to 900 nm (invention of Configuration 10).

The resist is not sensitive to light in a near-infrared region having a wavelength of from 800 nm to 900 nm, and hence the light is used for alignment when the mask blank is placed in an exposure apparatus. As in this configuration, the laminated structure of the light-semitransmissive film 2 and the light shielding film 3 has a transmittance of 0.2% or less with respect to the ArF excimer laser light (wavelength: 193 nm), and a transmittance of 50% or less with respect to light having a wavelength in at least a part of the wavelength region of from 800 nm to 900 nm. Thus, the laminated structure has good light shielding property with respect to the ArF excimer laser light as the exposure light, which is required of the light shielding band, for example, and enables easy placement of the mask blank in the exposure apparatus in a preferred manner.

Moreover, in the mask blank 10 of this embodiment, both of the hard mask film 4 and light-semitransmissive film 2 may be patterned by the dry etching using the fluorine-based gas. Consequently, together with the substantially accurate transfer of the pattern shape of the hard mask film 4, which is immediately above the upper layer 33 of the light shielding film 3, to the upper layer 33, the transfer pattern having the excellent form accuracy of the pattern may be formed in the light-semitransmissive film 2 by the patterning by means of the anisotropic etching using the light shielding film 3 as the mask.

This invention also provides a method of manufacturing a transfer mask using the above-mentioned mask blank according to this invention.

FIG. 2A to FIG. 2E are schematic cross-sectional views of the mask blank and the like, for illustrating manufacturing steps of the transfer mask using the mask blank 10 according to the embodiment of this invention. FIG. 2A to FIG. 2E are intended to enhance the understanding of the manufacturing steps, and cross-sectional shapes of the patterns illustrated in FIG. 2A to FIG. 2E do not correctly represent cross-sectional shapes that are actually formed.

Figure 2A:
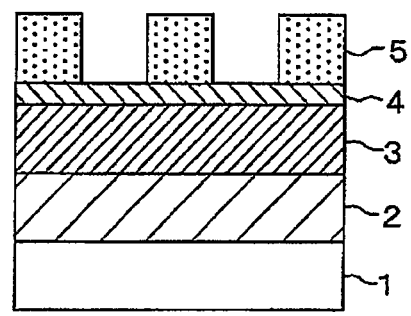
FIG. 2A is a schematic cross-sectional view of the mask blank and the like, for illustrating a manufacturing step of a transfer mask using the mask blank according to this invention.

First, a predetermined resist pattern 5 is formed on the surface of the mask blank 10 (see FIG. 2A). This resist pattern 5 has a desired pattern, which is the final transfer pattern to be formed in the light-semitransmissive film 2.

Figure 2B:
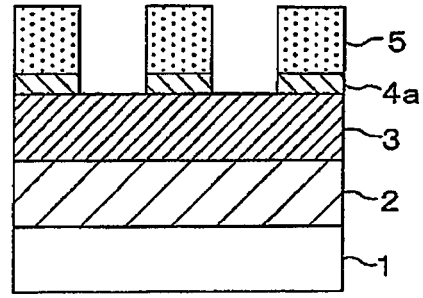
FIG. 2B is a schematic cross-sectional view of the mask blank and the like, for illustrating a manufacturing step of the transfer mask using the mask blank according to this invention.

Next, a hard mask film pattern 4a corresponding to the pattern of the light-semitransmissive film is formed in the hard mask film 4 by the dry etching using the fluorine-based gas, and using as a mask the resist pattern 5, which is formed on the hard mask film 4 of the mask blank 10 and has the above-mentioned light-semitransmissive film pattern (see FIG. 2B).

Next, a light shielding film pattern 3a corresponding to the light-semitransmissive film pattern is formed in the light shielding film 3 having the laminated structure by the dry etching using the mixture gas of the chlorine gas and the oxygen gas, and using as a mask the hard mask film pattern 4a formed as described above (see FIG. 2C).

Next, a light-semitransmissive film pattern 2a is formed in the light-semitransmissive film 2 by the dry etching using the fluorine-based gas, and using as a mask the light shielding film pattern 3a formed as described above (see FIG. 2D).

In the etching step of the light-semitransmissive film 2, the hard mask film pattern 4a that is exposed on the surface is removed.

Next, a resist film is applied on the entire surface of the light shielding film pattern 3a, and a resist pattern (not shown), which corresponds to the light shielding pattern (for example, light shielding band pattern) to be formed in the light shielding film, is formed through predetermined exposure and development processing. Then, a predetermined light shielding pattern 3b is formed in the light-semitransmissive film pattern 2a by the dry etching using the mixture gas of the chlorine gas and the oxygen gas, and using the resist pattern as a mask. Finally, the remaining resist pattern is removed to complete a transfer mask (for example, halftone-type phase shift mask) 20 (see FIG. 2E).

As is apparent from the above description, the transfer mask may be manufactured following the above-mentioned manufacturing steps using the mask blank 10 according to the embodiment of this invention to obtain the transfer mask in which even such fine transfer pattern as the SRAF pattern is formed with high pattern accuracy. In other words, according to the mask blank 10 of the embodiment of this invention, the etching rate is the lowest for the upper layer 33 of the light shielding film 3, and hence the pattern of the upper layer is less susceptible to the side etching. As a result, the pattern of the light shielding film 3 to which the shape of the transfer pattern, which is formed in the resist film or the hard mask film 4, is transferred substantially accurately may be formed, and hence the accuracy of the pattern, which is to be formed in the light-semitransmissive film 2 using the light shielding film pattern as the mask, may be increased. Moreover, the etching rate of the lower layer 31 of the light shielding film 3 is the next lowest to that for the upper layer 33, and is lower as compared to that of the intermediate layer 32, and hence the pattern of the lower layer may be made less susceptible to the side etching. As a result, the sufficient contact area between the light shielding film pattern and the light-semitransmissive film 2 may be secured, and the good adhesion may be obtained. Therefore, even when such fine pattern as the SRAF pattern is formed, the light shielding film pattern does not fall, and hence the pattern of the light-semitransmissive film 2 may also be formed with the high pattern accuracy.

Moreover, according to a method of manufacturing a semiconductor device, which includes a step of patterning and transferring the transfer pattern of the transfer mask to the semiconductor substrate by a lithography method using the transfer mask which has been manufactured by the above-mentioned method of manufacturing the transfer mask according to this invention and in which the above-mentioned fine pattern is formed with the high pattern accuracy, a high-quality semiconductor device with excellent pattern accuracy may be obtained.

EXAMPLE

Now, the present invention is described in more detail by way of Examples.

Example 1

Example according to this invention relates to a mask blank for use in manufacturing of a halftone-type phase shift mask using the ArF excimer laser having the wavelength of 193 nm as the exposure light.

The mask blank used in this Example has the structure in which the light-semitransmissive film 2, the light shielding film 3 having the three-layer laminated structure, and the hard mask film 4 are laminated in the stated order on the transparent substrate (glass substrate) 1 as illustrated in FIG. 1. This mask blank was manufactured as follows.

As the glass substrate, a synthetic quartz substrate (having a size of about 152 mm by about 152 mm and a thickness of 6.35 mm) was prepared.

Then, the above-mentioned synthetic quartz substrate was placed in a sheet-type DC sputtering apparatus, and a MoSiN light-semitransmissive film (phase shift film) made of molybdenum, silicon, and nitrogen was formed to have a thickness of 69 nm on the synthetic quartz substrate by reactive sputtering (DC sputtering) using a mixed sintered target of molybdenum (Mo) and silicon (Si) (Mo:Si=12 at %:88 at %), and using as a sputtering gas a mixture gas of argon (Ar), nitrogen ($N_2$), and helium (He) (at a ratio of flow rates of Ar:$N_2$:He=8:72:100 and a pressure of 0.2 Pa). A composition of the formed MoSiN film was Mo:Si:N=4.1:35.6:60.3 (at % ratio). The composition was measured by XPS.

Next, the substrate was taken out of the sputtering apparatus, and heating processing in the air was performed on the light-semitransmissive film on the above-mentioned synthetic quartz substrate. This heating processing was performed at 450° C. for 30 minutes. On the light-semitransmissive film after this heating processing, when a transmittance and a phase shift amount at the wavelength (193 nm) of the ArF excimer laser were measured using a phase shift amount measurement apparatus, the transmittance was 6.44%, and the phase shift amount was 174.3 degrees.

Next, the substrate on which the above-mentioned light-semitransmissive film had been formed was put in the sputtering apparatus again, and a light shielding film having a laminated structure of a lower layer made of a CrOCN film, an intermediate layer made of a CrOCN film, and an upper layer made of a CrN film was formed on the above-mentioned light-semitransmissive film. Specifically, reactive sputtering was performed in a mixture gas atmosphere of argon (Ar), carbon dioxide ($CO_2$), nitrogen ($N_2$), and helium (He) (at a ratio of flow rates of Ar:$CO_2$:$N_2$:He=20:25:13:30 and a pressure of 0.3 Pa) using a target made of chromium so that the lower layer of the light shielding film made of the CrOCN film was formed to have a thickness of 15.4 nm on the above-mentioned light-semitransmissive film. Subsequently, reactive sputtering was performed in a mixture gas atmosphere of argon (Ar), carbon dioxide ($CO_2$), nitrogen ($N_2$), and helium (He) (at a ratio of flow rates of Ar:$CO_2$:$N_2$:He=20:24:22:30 and a pressure of 0.3 Pa) similarly using the target made of chromium so that the intermediate layer of the light shielding film made of the CrOCN film was formed to have a thickness of 26.6 nm on the above-mentioned lower layer. Then reactive sputtering was performed in a mixture gas atmosphere of argon (Ar) and nitrogen ($N_2$) (at a ratio of flow rates of Ar:$N_2$=25:5 and a pressure of 0.3 Pa) similarly using the target made of chromium so that the upper layer of the light shielding film made of the CrN film was formed to have a thickness of 3.5 nm on the above-mentioned intermediate layer.

A composition of the formed CrOCN film as the lower layer of the light shielding film was Cr:O:C:N=55.2:22.1:11.6:11.1 (at % ratio). Moreover, a composition of the CrOCN film as the intermediate layer of the light shielding film was Cr:O:C:N=49.2:23.8:13.0:14.0 (at % ratio), and a composition of the CrN film as the upper layer of the light shielding film was Cr:N=76.2:23.8 (at % ratio). Those compositions were measured by XPS.

Next, a hard mask film made of a SiON film was formed on the above-mentioned light shielding film. Specifically, reactive sputtering was performed in a mixture gas atmosphere of argon (Ar), nitrogen monoxide (NO), and helium (He) (at a ratio of flow rates of Ar:NO:He=8:29:32 and a pressure of 0.3 Pa) using a target of silicon so that the hard mask film made of the SiON film was formed to have a thickness of 15 nm on the above-mentioned light shielding film. A composition of the formed SiON film was Si:O:N=37:44:19 (at % ratio). The composition was measured by XPS.

An optical density of the above-mentioned laminated structure of the light-semitransmissive film and the light shielding film was 3.0 or more (transmittance of 0.1% or less) at the wavelength (193 nm) of the ArF excimer laser. Moreover, a transmittance at a wavelength of 880 nm (wavelength used for alignment of the substrate to be loaded in an exposure apparatus) was 50% or less.

The mask blank according to this Example was manufactured as described above.

Next, a halftone-type phase shift mask was manufactured using the mask blank and following the above-mentioned manufacturing steps illustrated in FIG. 2A to FIG. 2E. Reference numerals in the following description correspond to the reference numerals in FIG. 1 and FIG. 2A to FIG. 2E.

First, HMDS processing was performed on an upper surface of the mask blank 10. A chemical amplification resist for electron beam lithography (PRL 009 manufactured by FUJIFILM Electronic Materials Co., Ltd.) was applied by spin coating, and predetermined baking processing was performed so that a resist film was formed to have a film thickness of 150 nm.

Next, a predetermined device pattern (pattern corresponding to a phase shift pattern to be formed in the light-semitransmissive film 2 (phase shift layer) and including lines and spaces (40 nm)) was drawn on the above-mentioned resist film using an electron beam lithography apparatus. Then, the resist film was developed to form a resist pattern 5 (see FIG. 2A).

Next, the hard mask film 4 was dry-etched using the resist pattern 5 as the mask to form the hard mask film pattern 4a (see FIG. 2B). A fluorine-based gas ($SF_6$) was used as a dry etching gas.

Figure 2C:
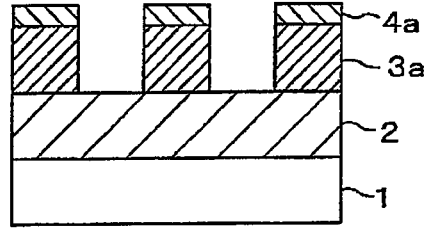
FIG. 2C is a schematic cross-sectional view of the mask blank and the like, for illustrating a manufacturing step of the transfer mask using the mask blank according to this invention.

After removing the resist pattern 5, the light shielding film 3 made of the laminate film of the upper layer, the intermediate layer, and the lower layer was dry-etched successively using the hard mask film pattern 4a as a mask to form the light shielding film pattern 3a (see FIG. 2C). A mixture gas of $Cl_2$ and $O_2$ ($Cl_2$:$O_2$=8:1 (ratio of flow rates)) was used as a dry etching gas. The etching rate of the light shielding film 3 was 2.9 Å/sec for the upper layer, 9.1 Å/sec for the intermediate layer, and 5.1 Å/sec for the lower layer.

Subsequently, the light-semitransmissive film 2 was dry-etched using the light shielding film pattern 3a as a mask to form the light-semitransmissive film pattern 2a (phase shift film pattern) (see FIG. 2D). A fluorine-based gas ($SF_6$) was used as a dry etching gas. In the etching step of the light-semitransmissive film 2, the hard mask film pattern 4a that is exposed on the front surface was removed.

Figure 2D:
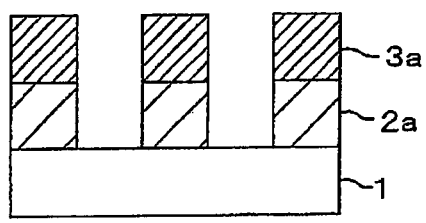
FIG. 2D is a schematic cross-sectional view of the mask blank and the like, for illustrating a manufacturing step of the transfer mask using the mask blank according to this invention.

Next, the above-mentioned resist film was formed again on the entire surface of the substrate in the above-mentioned state of FIG. 2D by spin coating. A predetermined device pattern (for example, pattern corresponding to light shielding band pattern) was drawn using the electron beam lithography apparatus, and was then developed to form the predetermined resist pattern. Subsequently, the exposed light shielding film pattern 3a was etched using the resist pattern as a mask to remove the light shielding film pattern 3a in, for example, a transfer pattern forming region, and a light shielding band pattern 3b was formed in a peripheral portion of the transfer pattern forming region. A mixture gas of $Cl_2$ and $O_2$ ($Cl_2:O_2$=8:1 (ratio of flow rates)) was used as a dry etching gas in this case.

Figure 2E:
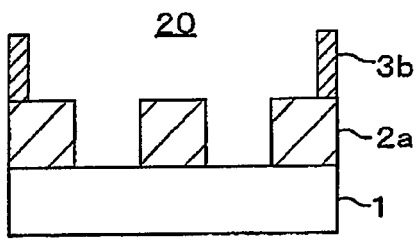
FIG. 2E is a schematic cross-sectional view of the mask blank and the like, for illustrating a manufacturing step of the transfer mask using the mask blank according to this invention.

Finally, the remaining resist pattern was removed to manufacture the halftone-type phase shift mask 20 (see FIG. 2E).

[Evaluation of Light Shielding Film Pattern]

Figure 3:
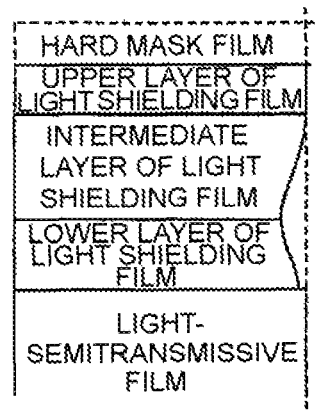
FIG. 3 is a cross-sectional view for illustrating a cross-sectional shape of a light shielding film pattern in Example of this invention.

When a cross-sectional shape of the light shielding film pattern was checked after the above-mentioned step of etching the light-semitransmissive film 2 (step in FIG. 2D) was ended, the cross-sectional shape as illustrated in FIG. 3 was observed. More specifically, the patterning was performed in a shape in which, although there was a constriction due to the erosion by the etching in the wall surface of the pattern in the intermediate layer portion of the light shielding film, the pattern width was recovered in the lower layer portion. The hard mask film pattern 4a had been removed at this point in time, and hence the state before the removal is illustrated by the broken line in FIG. 3.

Moreover, cleaning was performed after the step of patterning the light shielding film 3 (step in FIG. 2C) was ended, and when a state of the pattern of the lines and spaces of 40 nm (corresponding to a pattern dimension of the SRAF pattern) was checked, the light shielding film pattern had not fallen. It is considered that the falling had not occurred because the contact area between the lower layer of the light shielding film and the light-semitransmissive film was secured, and because the good connectivity at the interface between the lower layer of the light shielding film and the light-semitransmissive film secured the adhesion.

[Evaluation of Light-Semitransmissive Film Pattern]

When the light-semitransmissive film pattern formed by the dry etching using the above-mentioned light shielding film pattern as the mask was evaluated, as apparent from FIG. 3, even in the case of such fine pattern as the lines and spaces of 40 nm, the transfer pattern may be formed with little divergence in dimension from the hard mask film pattern and with excellent pattern accuracy.

Comparative Example

A mask blank was manufactured with the light-semitransmissive film and the hard mask film being films similar to those in Example 1 and with the configuration of the light shielding film being different from that in Example 1. More specifically, the light shielding film in this Comparative Example is a light shielding film having the single-layer structure, and is a thin film having the same composition as the composition of the intermediate layer of the light shielding film in Example 1, an optical density of 3.0 or more, and a film thickness of 100 nm.

The mask blank in this Comparative Example was used to manufacture a halftone-type phase shift mask in a method similar to that in Example 1.

[Evaluation of Light Shielding Film Pattern]

Figure 4:
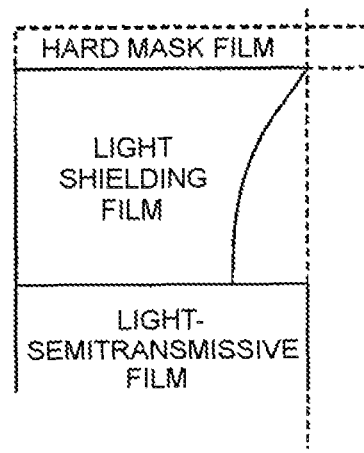
FIG. 4 is a cross-sectional view for illustrating a cross-sectional shape of a light shielding film pattern in Comparative Example of this invention.

When a cross-sectional shape of the light shielding film pattern was checked after the above-mentioned step of patterning the light shielding film 3 (step in FIG. 2C) was ended, the cross-sectional shape as illustrated in FIG. 4 was observed. More specifically, the light shielding film had a shape that was deeply hollowed by the erosion due to the etching in the wall surface of the pattern. Moreover, line widths were thinner than those in the pattern of the hard mask film, and had a tendency toward a large divergence in dimension from the hard mask film pattern.

Moreover, as in Example, cleaning was performed after the step of patterning the light shielding film 3 (step in FIG. 2C) was ended, and when a state of the pattern of the lines and spaces of 40 nm (corresponding to a pattern dimension of the SRAF pattern) was checked, the light shielding film pattern had fallen. When the pattern dimension was increased in steps of 10 nm, and a state of the light shielding film pattern was similarly checked, the falling of the pattern did not occur with lines and spaces of 80 nm. It is considered that the falling did not occur because wall surfaces of the light shielding film pattern were significantly eroded to reduce a contact area between the light shielding film and the light-semitransmissive film, and because it was not able to secure a connection state (adhesive state) that withstands the cleaning at the interface between the light shielding film and the light-semitransmissive film.

Therefore, even when such fine pattern as, for example, the lines and spaces of 40 nm was to be formed using the mask blank in this Comparative Example, the light shielding film falls, and it is difficult to pattern the light-semitransmissive film, which functions as a final transfer pattern.

The embodiment and Example of this invention have been described above. However, those embodiment and Example are merely exemplary, and do not limit the scope of claims. The technology described in the scope of claims encompasses various alterations and modifications to the specific examples exemplified above.

REFERENCE SIGNS LIST 1 transparent substrate
2 light-semitransmissive film
3 light shielding film
31 lower layer of light shielding film
32 intermediate layer of light shielding film
33 upper layer of light shielding film
4 hard mask film
5 resist pattern
10 mask blank
20 transfer mask

The invention claimed is:

1. A mask blank having a structure in which a light-semitransmissive film, a light shielding film, and a hard mask film are laminated in the stated order on a transparent substrate,
   the light-semitransmissive film at least containing silicon,
   the hard mask film at least containing any one or both of silicon and tantalum,
   the light shielding film having a laminated structure of a lower layer, an intermediate layer, and an upper layer, and containing chromium,
   wherein the light shielding film has a highest content of the chromium in the upper layer, and a next highest content of the chromium in the lower layer, and
   wherein, when the light shielding film is dry-etched using a mixture gas of a chlorine gas and an oxygen gas, the light shielding film is dry-etched at a lowest etching rate in the upper layer and is dry-etched at a next lowest etching rate in the lower layer.

2. The mask blank according to claim 1, wherein the light shielding film further contains oxygen, and has a content of the oxygen that is lower in the lower layer than in the intermediate layer.

3. The mask blank according to claim 1, wherein the upper layer has a content of the chromium of 60 atomic % or more.

4. The mask blank according to claim 1, wherein the upper layer has a thickness of 3 nm or more and 8 nm or less.

5. The mask blank according to claim 1, wherein the intermediate layer is dry-etched using the mixture gas of the chlorine gas and the oxygen gas at the etching rate that is three times the etching rate at which the upper layer is dry-etched using the mixture gas of the chlorine gas and the oxygen gas or more.

6. The mask blank according to claim 1, wherein the intermediate layer is dry-etched using the mixture gas of the chlorine gas and the oxygen gas at the etching rate that is two times the etching rate at which the lower layer is dry-etched using the mixture gas of the chlorine gas and the oxygen gas or less.

7. The mask blank according to claim 1, wherein the hard mask film contains oxygen.

8. The mask blank according to claim 1, wherein the light-semitransmissive film contains silicon and nitrogen.

9. The mask blank according to claim 1, wherein the light-semitransmissive film and the light shielding film form a laminated structure having a transmittance of 0.2% or less with respect to an ArF excimer laser light (wavelength: 193 nm), and a transmittance of 50% or less with respect to light having a wavelength in at least a part of a wavelength region of from 800 nm to 900 nm.

10. The mask blank according to claim 1, wherein the hard mask film and the light-semitransmissive film are patterned by dry etching using a fluorine-based gas.

11. A method of manufacturing a transfer mask using the mask blank of claim 1, the method comprising the steps of:
forming a light-semitransmissive film pattern in the hard mask film by dry etching using a fluorine-based gas and using as a mask a resist film, which is formed on the hard mask film and has the light-semitransmissive film pattern;
forming the light-semitransmissive film pattern in the light shielding film by dry etching using a mixture gas of a chlorine gas and an oxygen gas, and using as a mask the hard mask film, in which the light-semitransmissive film pattern has been formed;
forming the light-semitransmissive film pattern in the light-semitransmissive film by dry etching using a fluorine-based gas and using as a mask the light shielding film, in which the light-semitransmissive film pattern has been formed; and
forming a light shielding pattern in the light shielding film by dry etching using a mixture gas of a chlorine gas and an oxygen gas, and using as a mask a resist film, which is formed on the light shielding film and has the light shielding pattern.

12. A method of manufacturing a semiconductor device, comprising a step of patterning and transferring a transfer pattern of a transfer mask, which is manufactured by the method of manufacturing a transfer mask of claim 11, on a semiconductor substrate by a lithography method using the transfer mask.

* * * * *